(12) United States Patent
Lee et al.

(10) Patent No.: US 11,037,868 B2
(45) Date of Patent: Jun. 15, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Hui Hua Lee, Kaohsiung (TW); Hui-Ying Hsieh, Kaohsiung (TW); Cheng-Hung Ko, Kaohsiung (TW); Chi-Tsung Chiu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/801,061

(22) Filed: Feb. 25, 2020

(65) Prior Publication Data

US 2020/0194356 A1   Jun. 18, 2020

Related U.S. Application Data

(63) Continuation of application No. 16/156,991, filed on Oct. 10, 2018, now Pat. No. 10,615,105.
(Continued)

(51) Int. Cl.
*H01L 23/00* (2006.01)
*H01L 23/31* (2006.01)
(Continued)

(52) U.S. Cl.
CPC .... *H01L 23/49568* (2013.01); *H01L 21/4825* (2013.01); *H01L 21/565* (2013.01);
(Continued)

(58) Field of Classification Search
CPC ............. H01L 23/3107; H01L 23/3128; H01L 23/49527; H01L 23/49513;
(Continued)

(56) References Cited

U.S. PATENT DOCUMENTS 6,284,985 B1   9/2001   Naba et al.
6,977,431 B1   12/2005   Oh et al.
(Continued)

OTHER PUBLICATIONS

Final Office Action for U.S. Appl. No. 16/156,991, dated Sep. 26, 2019, 14 pages.
(Continued)

*Primary Examiner* — Peniel M Gumedzoe
(74) *Attorney, Agent, or Firm* — Foley & Lardner LLP

(57) ABSTRACT

A semiconductor device package includes a metal carrier, a passive device, a conductive adhesive material, a dielectric layer and a conductive via. The metal carrier has a first conductive pad and a second conductive pad spaced apart from the first conductive pad. The first conductive pad and the second conductive pad define a space therebetween. The passive device is disposed on top surfaces of first conductive pad and the second conductive pad. The conductive adhesive material electrically connects a first conductive contact and a second conductive contact of the passive device to the first conductive pad and the second conductive pad respectively. The dielectric layer covers the metal carrier and the passive device and exposes a bottom surface of the first conductive pad and the second conductive pad. The conductive via extends within the dielectric layer and is electrically connected to the first conductive pad and/or the second conductive pad.

17 Claims, 25 Drawing Sheets

Related U.S. Application Data

(60) Provisional application No. 62/575,143, filed on Oct. 20, 2017.

(51) Int. Cl.
    *H01L 21/48*     (2006.01)
    *H01L 21/56*     (2006.01)
    *H01L 23/495*     (2006.01)

(52) U.S. Cl.
    CPC ...... *H01L 23/3107* (2013.01); *H01L 23/3128* (2013.01); *H01L 23/49513* (2013.01); *H01L 23/49517* (2013.01); *H01L 23/49527* (2013.01); *H01L 23/49548* (2013.01); *H01L 23/49575* (2013.01); *H01L 23/49589* (2013.01); *H01L 24/32* (2013.01); *H01L 21/4828* (2013.01); *H01L 21/561* (2013.01); *H01L 2224/32257* (2013.01)

(58) Field of Classification Search
    CPC ......... H01L 23/49548; H01L 23/49575; H01L 23/49568; H01L 23/49589; H01L 23/49517
See application file for complete search history.

(56) References Cited

U.S. PATENT DOCUMENTS

| | | | |
|---|---|---|---|
| 7,489,021 B2* | 2/2009 | Juskey | H01L 23/3107 257/666 |
| 7,960,816 B2 | 6/2011 | Chow et al. | |
| 2005/0056916 A1* | 3/2005 | Sakamoto | H01L 25/50 257/672 |
| 2008/0296735 A1 | 12/2008 | Takehara et al. | |
| 2009/0190320 A1* | 7/2009 | Shimizu | H01L 23/49575 361/809 |
| 2015/0303164 A1 | 10/2015 | Chen | |
| 2017/0186545 A1 | 6/2017 | Nishimura et al. | |

OTHER PUBLICATIONS

Non-Final Office Action for U.S. Appl. No. 16/156,991, dated Jun. 13, 2019, 15 pages.

Notice of Allowance for U.S. Appl. No. 16/156,991, dated Jan. 14, 2020, 8 pages.

\* cited by examiner

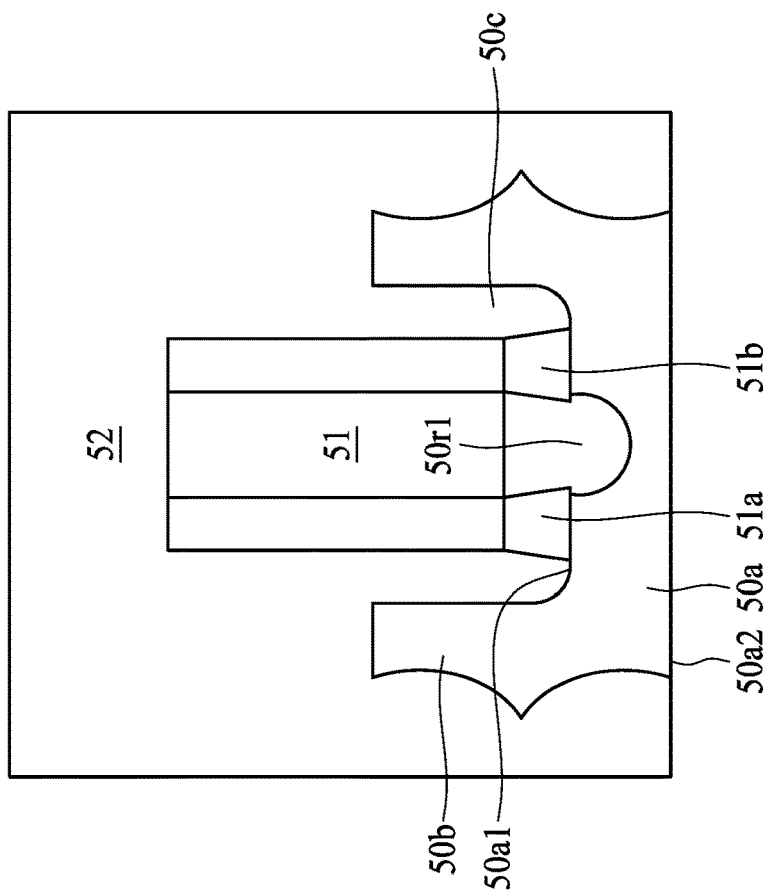
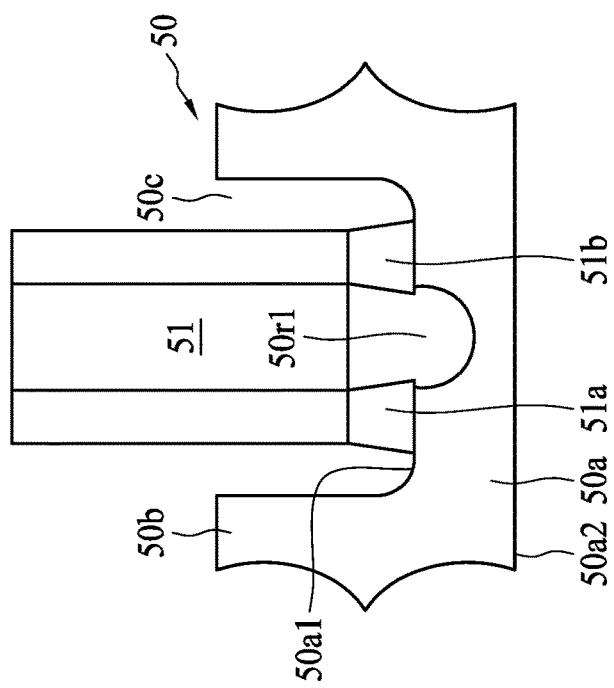
FIG. 5D
FIG. 5C

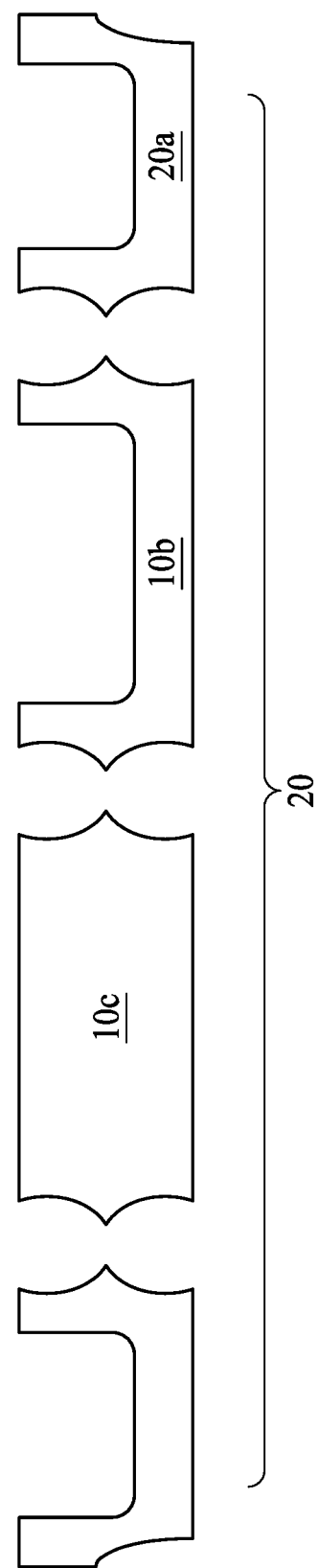

SEMICONDUCTOR DEVICE PACKAGE AND METHOD OF MANUFACTURING THE SAME

CROSS-REFERENCE TO RELATED APPLICATIONS

This application is a continuation of U.S. patent application Ser. No. 16/156,991, filed Oct. 10, 2018, which claims the benefit of and priority to U.S. Provisional Application No. 62/575,143, filed Oct. 20, 2017, the contents of which are incorporated herein by reference in their entirety.

BACKGROUND

1. Technical Field

The present disclosure relates to a semiconductor device package and a method of manufacturing the same, and to a semiconductor device package including a power die and a manufacturing method thereof.

2. Description of the Related Art

In a semiconductor device package (e.g., system in package, SIP), a molding compound is used to protect active or passive devices, but the molding compound will hinder the heat dissipation for the active or passive devices. To enhance the heat dissipation for the active or passive devices, the active or passive devices can be embedded in a carrier (leadframe or substrate) with more efficient heat dissipation design.

To form electrical connections for the embedded active or passive devices, a portion of insulation material (e.g., prepreg) which covers the active or passive devices may be removed (by e.g., a laser drilling technique) to form a via hole. Conductive material(s) (e.g., copper (Cu), silver (Ag) or the like) may be filled into the via hole by, for example, plating technique. The conductive contacts/terminals of the passive element for external connection generally include tin (Sn) or solder material. However, to facilitate manufacturing a conductive via for an embedded passive device by plating technique, the conductive contacts/terminals may be changed from solder/Sn to a material having relatively greater conductivity (e.g., Cu, Ag or other suitable material (s)), and such customized structure may inevitably increase the manufacturing cost of semiconductor device packages.

SUMMARY

In some embodiments, a semiconductor device package includes a metal carrier, a passive device, a conductive adhesive material, a dielectric layer and a conductive via. The metal carrier has a first conductive pad and a second conductive pad spaced apart from the first conductive pad. Each of the first conductive pad and the second conductive pad has a top surface and a bottom surface. The first conductive pad and the second conductive pad define a space therebetween. The passive device is disposed on the top surface of first conductive pad and the second conductive pad. The passive device has a first conductive contact and a second conductive contact. The conductive adhesive material electrically connects the first conductive contact and the second conductive contact of the passive device to the first conductive pad and the second conductive pad respectively. The dielectric layer covers the metal carrier and the passive device and exposes the bottom surface of the first conductive pad and the second conductive pad. The conductive via extends within the dielectric layer and is electrically connected to at least one of the first conductive pad and the second conductive pad.

In some embodiments, according to another aspect, a semiconductor device package includes a metal carrier, a passive device, a conductive adhesive material and a dielectric layer. The metal carrier has a first conductive pad and a second conductive pad spaced apart from the first conductive pad. Each of the first conductive pad and the second conductive pad has a top surface and a bottom surface. The first conductive pad and the second conductive pad define a space therebetween. The passive device is disposed on the top surface of first conductive pad and the second conductive pad. The passive device has a first conductive contact and a second conductive contact. The first conductive contact and the second conductive contact include tin. The conductive adhesive material electrically connects the first conductive contact and the second conductive contact of the passive device to the first conductive pad and the second conductive pad respectively. The dielectric layer covers the metal carrier and the passive device and exposes the bottom surface of the first conductive pad and the second conductive pad.

In some embodiments, a method for manufacturing a semiconductor device package includes (a) proving a metal carrier having a first conductive pad and a second conductive pad connected to the first conductive pad through a connection part; (b) connecting a passive device to the first conductive pad and the second conductive pad through a conductive adhesive material; (c) forming a dielectric layer covering the metal carrier and the passive device; and (d) removing the connection part to separate the first conductive pad from the second conductive pad to form a space therebetween. The space is exposed from the dielectric layer.

BRIEF DESCRIPTION OF THE DRAWINGS

FIG. 5A, FIG. 5B, FIG. 5C, FIG. 5D and FIG. 5E illustrate a manufacturing process in accordance with some embodiments of the present disclosure.

FIG. 8A, FIG. 8B and FIG. 8C illustrate a manufacturing process in accordance with some embodiments of the present disclosure.

Figure 1A:
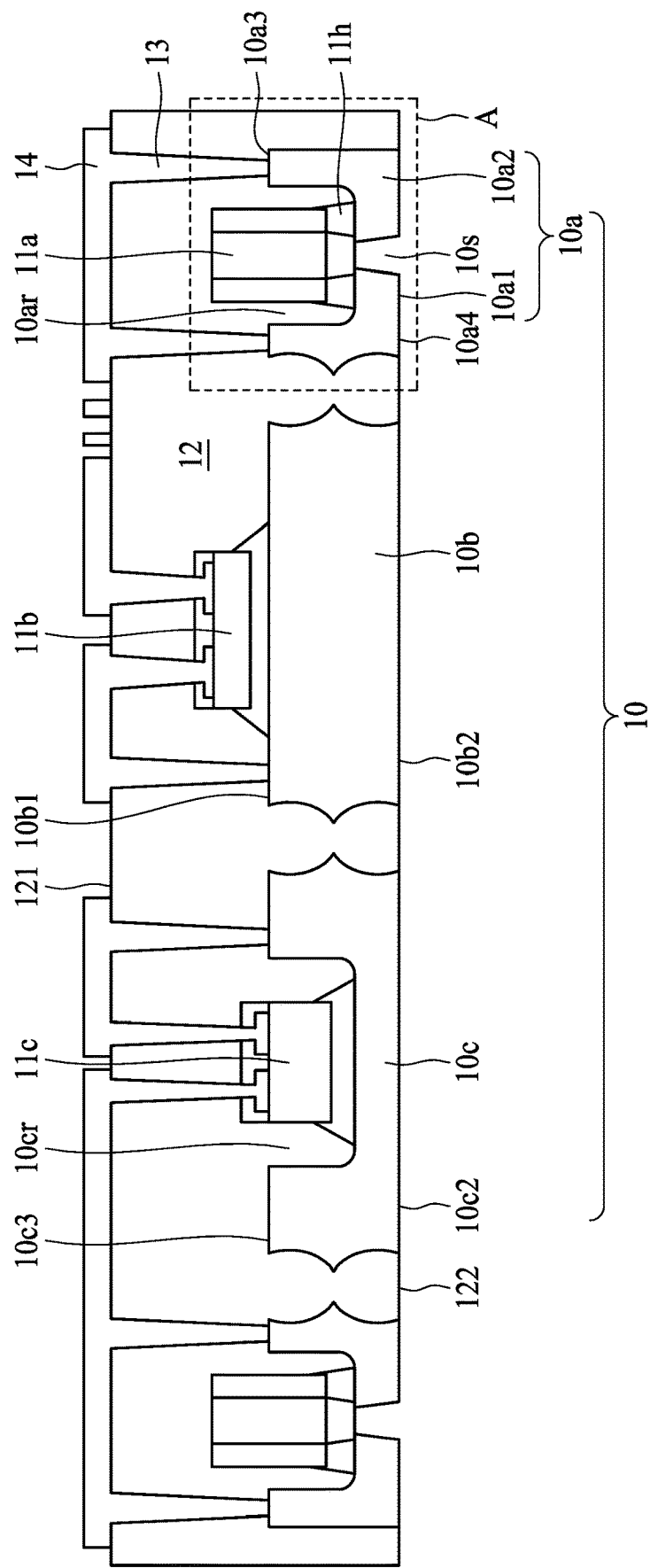
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1 in accordance with some embodiments of the present disclosure. The semiconductor device package 1 includes a metal carrier 10, electronic components 11a, 11b, 11c, a dielectric layer 12, a conductive via 13 and a conductive layer 14.

The metal carrier 10 may be a leadframe or a portion of a leadframe. For example, the metal carrier 10 is a leadframe including one or more die pads (or die paddles) 10a, 10b and 10c. The die pads 10a, 10b and 10c are separated from each other. For example, there is a gap between any two adjacent die pads. In some embodiments, the metal carrier 10 is, or includes, copper or a copper alloy. In some embodiments, tin may be plated on the metal carrier 10. In other embodiments, the metal carrier 10 includes one of, or a combination of, iron, an iron alloy, nickel, a nickel alloy, or another metal or metal alloy. In some embodiments, the metal carrier 10 is coated with a silver or copper layer.

In some embodiments, the die pad 10a includes a cavity 10ar for accommodating the electronic component 11a. The die pad 10a includes two portions 10a1 and 10a2 physically spaced apart from each other. There is a gap 10s between the portion 10a1 of the die pad 10a and the portion 10a2 of the die pad 10a. In some embodiments, the die pad 10c includes a cavity 10cr for accommodating the electronic component 11c. In some embodiments, the top surfaces 10a3, 10b1 and 10c1 of the die pads 10a, 10b and 10c are substantially coplanar. Alternatively, the top surfaces 10a3, 10b1 and 10c1 of the die pads 10a, 10b and 10c may have different heights. In some embodiments, the bottom surfaces 10a4, 10b2 and 10c2 of the die pads 10a, 10b and 10c are substantially coplanar.

Figure 1C:
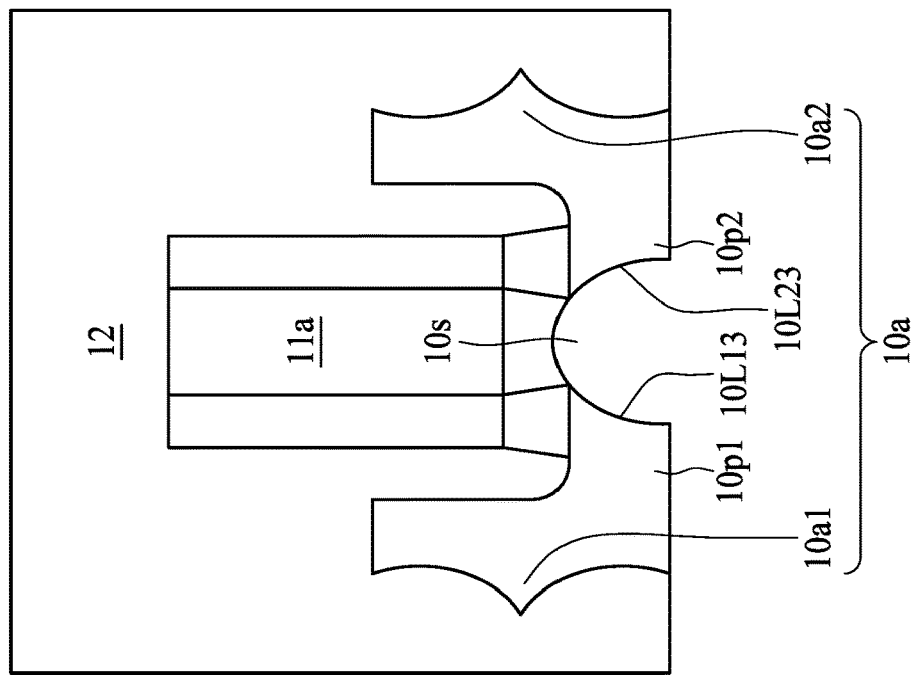
FIG. 1C illustrates an enlarged view of a portion of the die pad in FIG. 1A in accordance with some embodiments of the present disclosure.
Figure 1B:
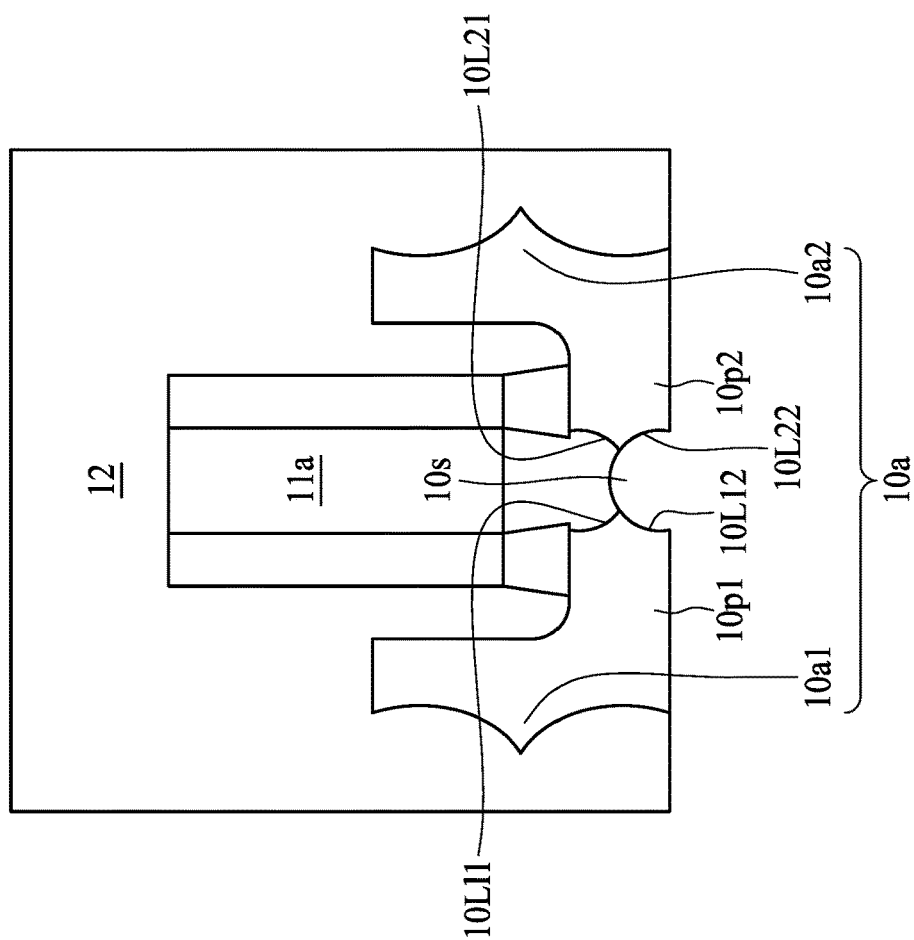
FIG. 1B illustrates an enlarged view of a portion of the die pad in FIG. 1A in accordance with some embodiments of the present disclosure.

FIG. 1B illustrates an enlarged view of a portion of the die pad 10a in FIG. 1A circled by a dotted-line rectangle A in accordance with some embodiments of the present disclosure. For the purpose of clarity, the conductive via 13 is omitted in FIG. 1B. The portion 10a1 of the die pad 10a of the metal carrier 10 includes a conductive pad 10p1 and the portion 10a2 of the die pad 10a of the metal carrier 10 includes a conductive pad 10p2. The conductive pad 10p1 includes a first lateral surface 10L11 and a second lateral surface 10L12. The conductive pad 10p2 includes a first lateral surface 10L21 and a second lateral surface 10L22 which respectively facing toward the first lateral surface 10L11 and the second lateral surface 10L12 of the conductive pad 10p1. In some embodiments, the first lateral surface 10L11 and the second lateral surface 10L12 are curved surfaces and connected to each other. The first lateral surface 10L21 and the second lateral surface 10L22 are curved surfaces and connected to each other. The first lateral surface 10L11 and the second lateral surface 10L12 of the conductive pad 10p1 are spaced apart from the first lateral surface 10L21 and the second lateral surface 10L22 of the conductive pad 10p2 to define the gap 10s therebetween.

FIG. 1C illustrates an enlarged view of a portion of the die pad 10a in FIG. 1A circled by a dotted-line rectangle A in accordance with other embodiments of the present disclosure. For the purpose of clarity, the conductive via 13 is omitted in FIG. 1C. The structure illustrated in FIG. 1C is similar to that in FIG. 1B except that in FIG. 1C, the conductive pad 10p1 has one curved surface 10L13 and the conductive pad 10p2 has one curved surface 10L23. The curved surface 10L13 is spaced apart from the curved surface 10L23 to define the gap 10s therebetween.

Referring back to FIG. 1A, the electronic component 11a is disposed within the cavity 10ar of the die pad 10a. In some embodiments, the electronic component 11a may include two conductive contacts, in which one conductive contact (which may be referred to as "the first conductive contact") is electrically connected to the portion 10a1 of the die pad 10a (e.g., on the conductive pad 10p1 as shown in FIG. 1B or FIG. 1C) and the other conductive contact (which may be referred to as "the second conductive contact") is electrically connected to the portion 10a2 of the die pad 10a (e.g., on the conductive pad 10p2 as shown in FIG. 1B or FIG. 1C). For example, the electronic component 11a is disposed across the gap 10s. In some embodiments, the conductive contacts of the electronic component 11a include tin or its alloy. In some embodiments, the electronic component 11a is attached to the die pad 10a through a conductive adhesive layer 11h (e.g., a solder, a plating film or a metal film). In some embodiments, the electronic component 11a is a passive device such a resistor, a capacitor, an inductor, or a combination thereof. The electronic component 11a is electrically connected to the conductive via 13 through the die pad 10a of the metal carrier 10. In some embodiments, the conductive via 13 includes tin or its alloy.

The electronic component 11b is disposed on the top surface 10b1 of the die pad 10b of the metal carrier 10. In some embodiments, a backside surface of the electronic component 11b is attached to the die pad 10b of the metal carrier 10 through an adhesive layer (e.g., glue or tape). An active surface of the electronic component 11b is electrically connected to the conductive via 13. The electronic component 11b may include a chip or a die including a semiconductor substrate, one or more integrated circuit devices and/or one or more overlying interconnection structures therein. The integrated circuit devices may include active devices such as transistors and/or passive devices such resistors, capacitors, inductors, or a combination thereof. In some embodiments, a thickness of the electronic component 11b is different from that of the electronic component 11a. For example, the thickness of the electronic component 11a is greater than that of the electronic component 11b.

The electronic component 11c is disposed within the cavity 10cr of the die pad 10c. In some embodiments, a backside surface of the electronic component 11c is attached to the die pad 10c of the metal carrier 10 through an adhesive layer (e.g., glue or tape). An active surface of the electronic component 11c is electrically connected to the conductive via 13. The electronic component 11c may include a chip or a die including a semiconductor substrate, one or more integrated circuit devices and/or one or more overlying interconnection structures therein. The integrated circuit devices may include active devices such as transistors and/or passive devices such resistors, capacitors, inductors, or a combination thereof. In some embodiments, a thickness of the electronic component 11c is different from that of the electronic component 11b. For example, the thickness of the electronic component 11c is greater than that of the electronic component 11b. In some embodiments, a top view of the conductive adhesive material 11h, the adhesive layer between the electronic component 11b and the die pad 10b or the adhesive layer between the electronic component 11c and the die pad 10c can be any shapes depending on different design specifications.

The dielectric layer 12 is disposed on the die pads 10a, 10b and 10c to cover or encapsulate the electronic components 11a, 11b and 11c. The dielectric layer 12 is disposed at the gap between any two adjacent die pads. For example, the dielectric layer 12 is disposed between the die pad 10a and the die pad 10b and the gap between the die pad 10b and the die pad 10c. The dielectric layer 12 exposes the bottom surfaces 10a4, 10b2 and 10c2 of the die pads 10a, 10b and 10c. In some embodiments, a bottom surface 122 of the dielectric layer 12 is substantially coplanar with the bottom surfaces 10a4, 10b2 and 10c2 of the die pads 10a, 10b and 10c. In some embodiments, the dielectric layer 12 may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets.

Figure 1D:
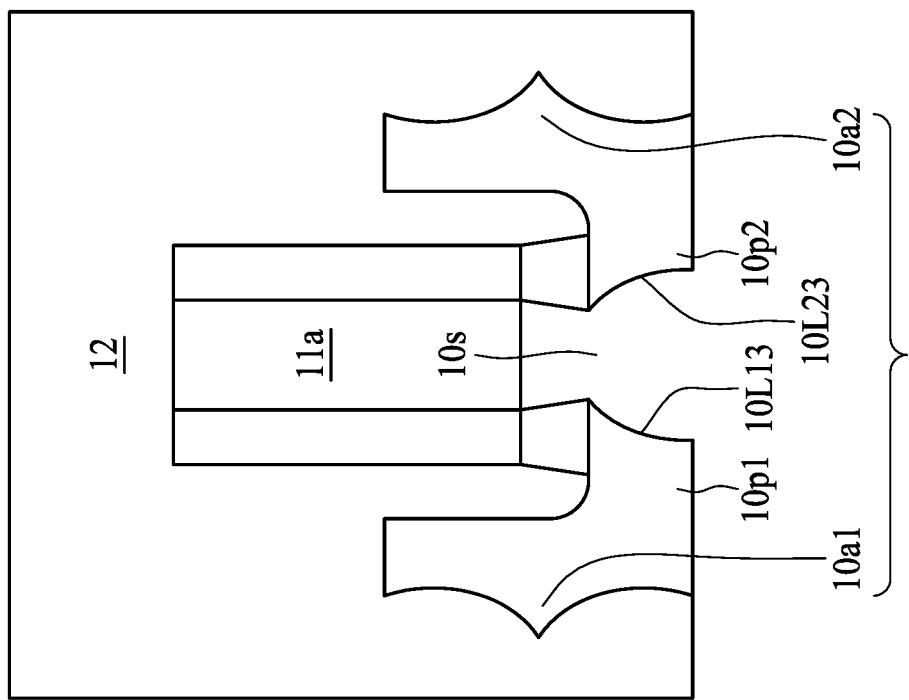
FIG. 1D illustrates an enlarged view of a portion of the die pad in FIG. 1A in accordance with some embodiments of the present disclosure.

In some embodiments, the dielectric layer 12 exposes a least a portion of the gap 10s between the portion 10a1 of the die pad 10a and the portion 10a2 of the die pad 10a. For example, as shown in FIG. 1B, the dielectric layer 12 is disposed between the first lateral surface 10L11 of the conductive pad 10p1 and the first lateral surface 10L21 of the conductive pad 10p2, and the dielectric layer 12 exposes a space between the second lateral surface 10L12 of the conductive pad 10p1 and the second lateral surface 10L22 of the conductive pad 10p2. For example, as shown in FIG. 1C, the dielectric layer 12 exposes the space between the curved surface 10L13 of the conductive pad 10p1 and the curved surface 10L23 of the conductive pad 10p2. In some embodiments, the dielectric layer 12 is disposed between two conductive contacts of the electronic component 11a as shown in FIG. 1B and FIG. 1C. Alternatively, the dielectric layer 12 may expose a portion of the conductive contacts of the electronic component 11a as shown in FIG. 1D, which illustrates an enlarged view of a portion of the die pad 10a in FIG. 1A circled by a dotted-line rectangle A in accordance with some embodiments of the present disclosure.

The conductive layer 14 is disposed on a top surface 121 of the dielectric layer 12. The conductive layer 14 is electrically connected to the electronic components 11a, 11b and 11c through the conductive vias 13. In some embodiments, the conductive layer 14 and the conductive via 13 are formed of the same material. Alternatively, the conductive layer 14 and the conductive via 13 may include different materials.

In accordance with the embodiments as shown in FIG. 1A, embedding both the active devices (e.g., the electronic components 11b and 11c) and the passive device (e.g., the electronic component 11a) within the dielectric layer 12 can improve the heat dissipation of the semiconductor device package 1. Furthermore, in some embodiments, since the conductive contacts of the passive device (e.g., the electronic component 11a) and the conductive via 13 are formed of the same material (e.g., tin or its alloy), it is unnecessary to use a customized passive device, which would in turn reduce the manufacturing cost of semiconductor device package 1. Moreover, placing the electronic components (e.g., the electronic components 11a and 11c) with relatively greater thickness into cavities (e.g., 10ar and 10cr) can reduce the total thickness of the semiconductor device package 1.

Figure 2:
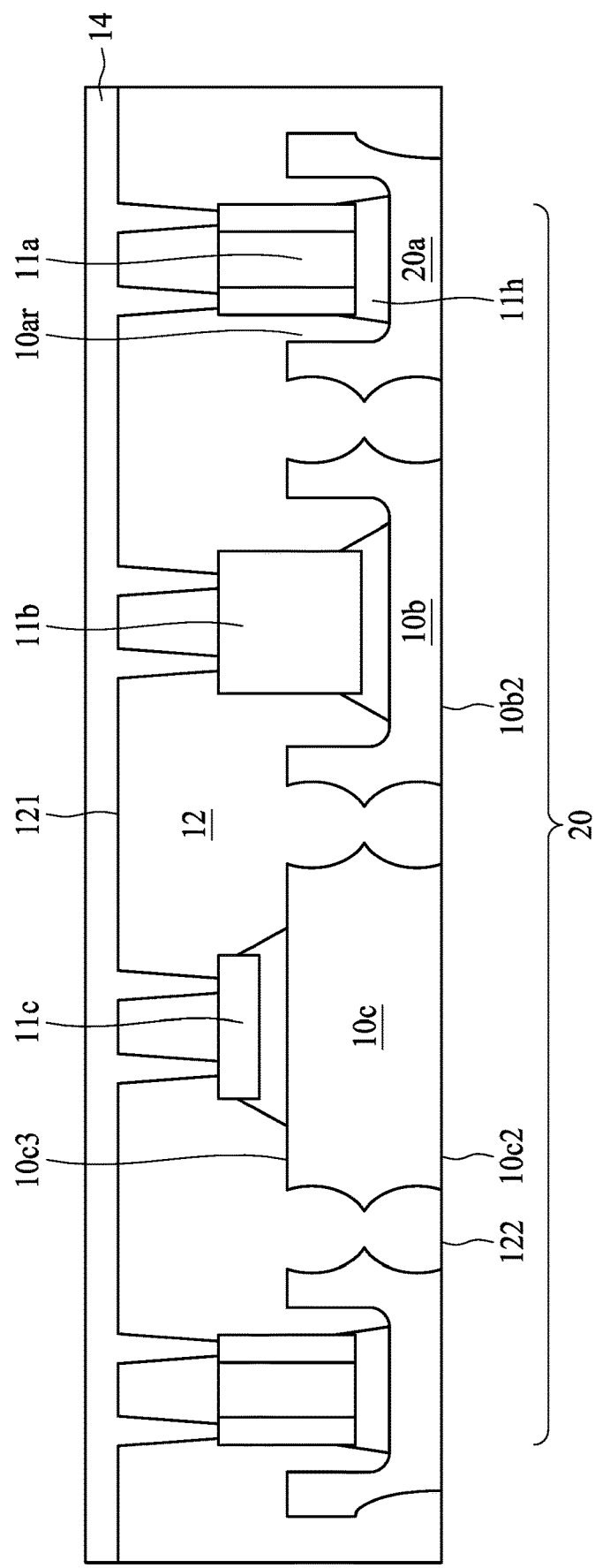
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 shown in FIG. 1A and the differences therebetween are described below. As shown in FIG. 2, the die pad 20a does not have a gap. In addition, all the electronic components 11a, 11b and 11c are directly connected to the conductive vias 13.

Figure 3:
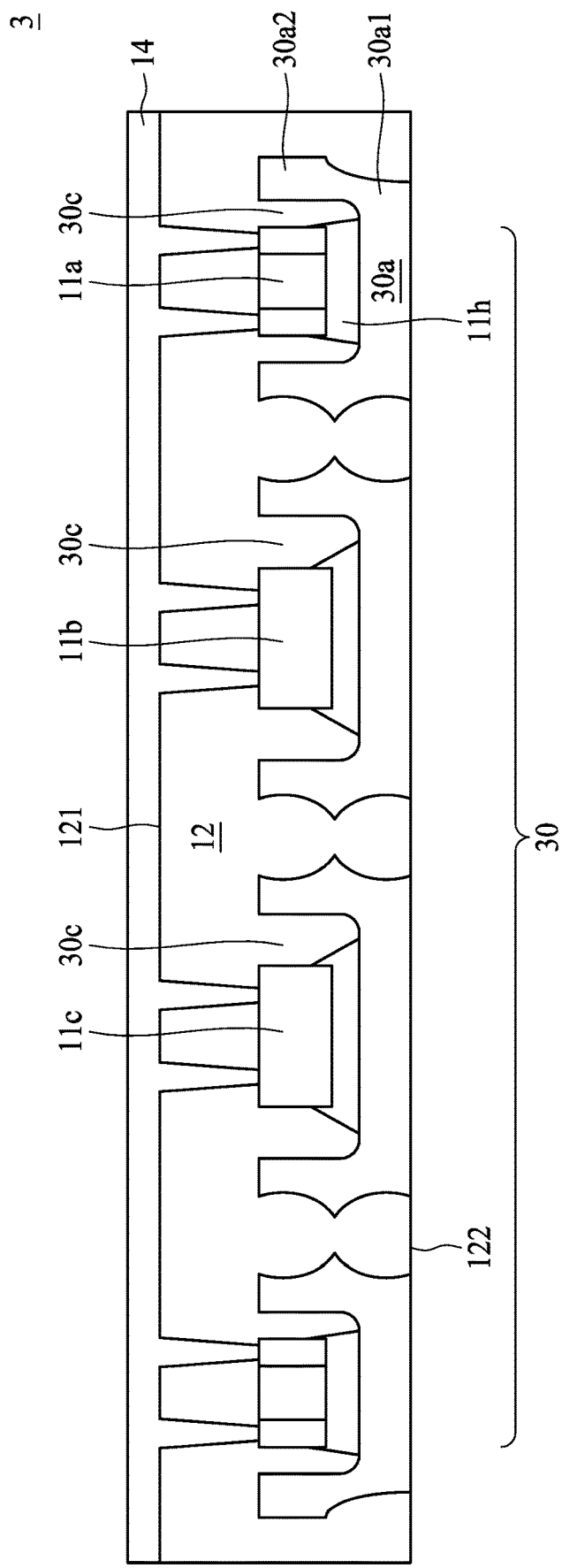
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 2 shown in FIG. 2 except that all the die pads of the metal carrier 30 have a cavity 30c to accommodate the electronic components 11a, 11b and 11c.

Figure 4:
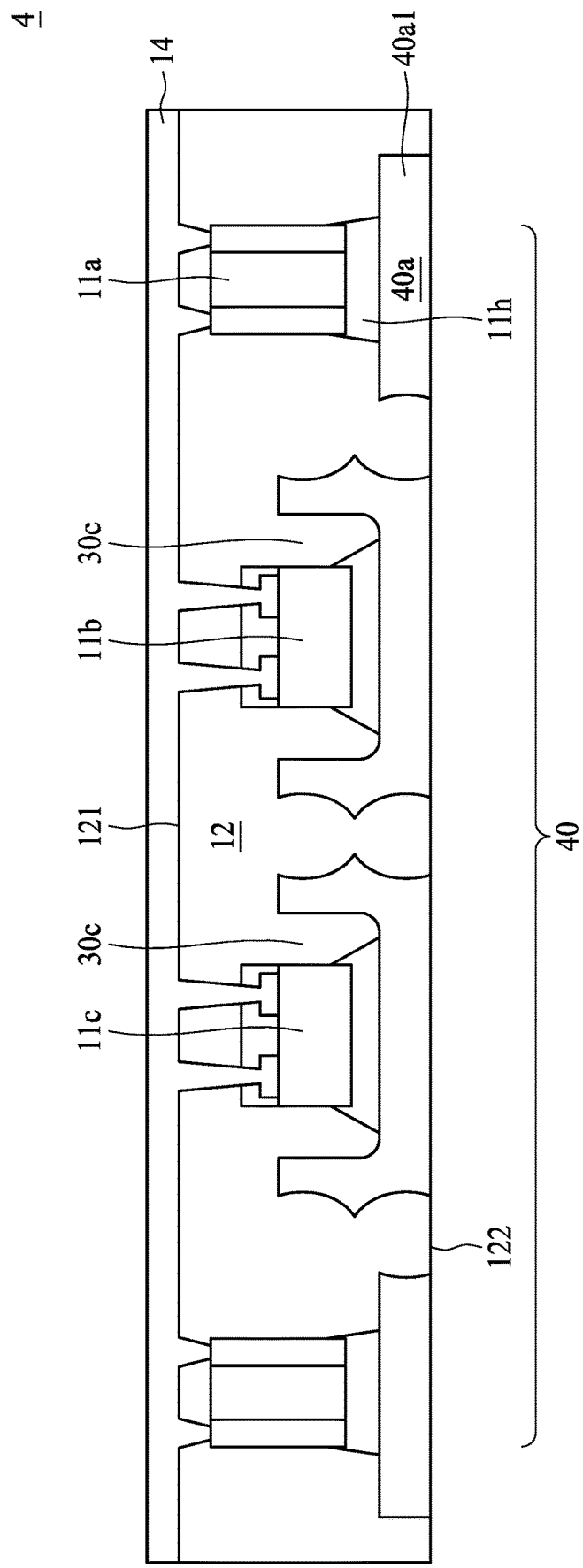
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 3 shown in FIG. 3 except that the sidewall of the cavity of some die pads (e.g., the die pad 40a) of the metal carrier 40 is removed. In other words, unlike the die pad 30a in FIG. 3 including a base portion 30a1 and an extension portion 30a2, the die pad 40a in FIG. 4 has a base portion 40a1 without an extension portion.

FIG. 5A, FIG. 5B, FIG. 5C, FIG. 5D and FIG. 5E illustrate a manufacturing process in accordance with some embodiments of the present disclosure. In some embodiments, the manufacturing process illustrated in FIG. 5A, FIG. 5B, FIG. 5C, FIG. 5D and FIG. 5E can be used to form the structure as shown in FIG. 1B.

Figure 5B:
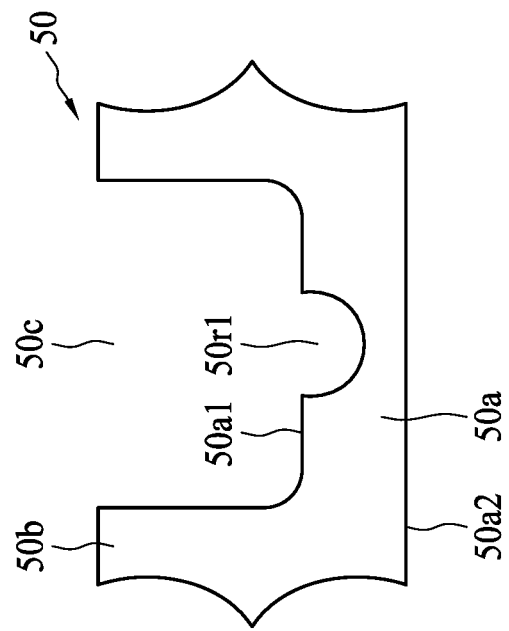
Figure 5A:
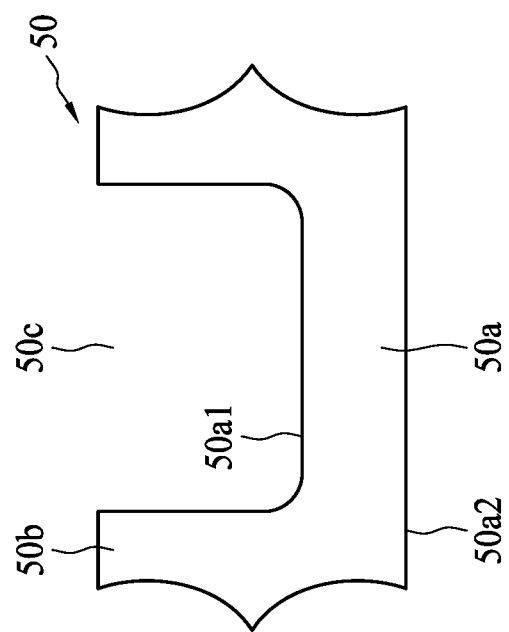

Referring to FIG. 5A, a metal carrier 50 (e.g., a leadframe or a portion of a leadframe) is provided. The metal carrier 50 has a base portion 50a and an extension portion 50b. The base portion 50a and the extension portion 50b define a cavity 50c. The base portion 50a has a top surface 50a1 and a bottom surface 50a2 opposite to the top surface 50a1.

Referring to FIG. 5B, a recess 50r1 is formed on the top surface 50a1 of the base portion 50a of the metal carrier 50. In some embodiments, the recess 50r1 can be formed by etching or other suitable operations.

Referring to FIG. 5C, an electronic component 51 is disposed within the cavity 50c of the metal carrier 50. The electronic component 51 is disposed on the base portion 50a of the metal carrier 50. The electronic component 51 is disposed over the recess 50r1. In some embodiments, the electronic component 51 may be a passive device (e.g., a resistor, a capacitor, an inductor or a combination thereof). The electronic component 51 includes two conductive contacts 51a and 51b, in which the conductive contact 51a is disposed at one side of the recess 50r1 and the conductive contact 51b is disposed at an opposite side of the recess 50r1.

Referring to FIG. 5D, a dielectric layer 52 is formed to cover a portion of the metal carrier 50 and the electronic component 51. The dielectric layer 52 exposes the bottom surface 50a2 of the metal carrier 50.

Figure 5E:
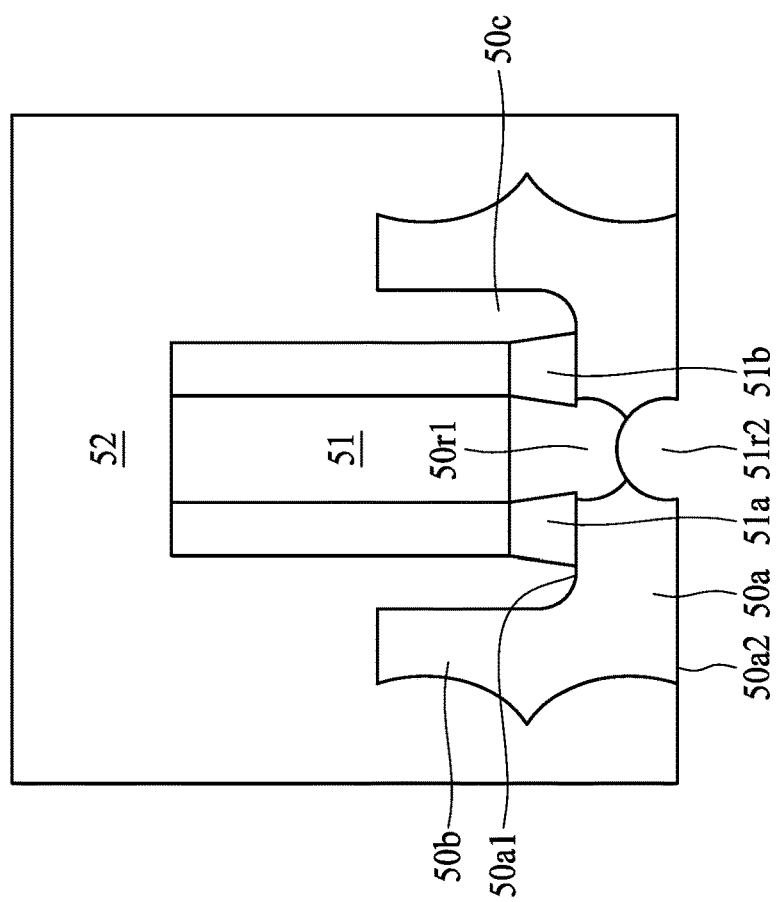

Referring to FIG. 5E, a portion of the dielectric layer 52 is removed to form an recess 50r2 on the bottom surface 50a2 of the metal carrier 50. The recess 50r2 is formed corresponding to the recess 50r1. The recess 50r2 is connected to the recess 50r1 to form a gap to divide the base portion 50a of the metal carrier 50 into two separated portions.

Figure 6A:
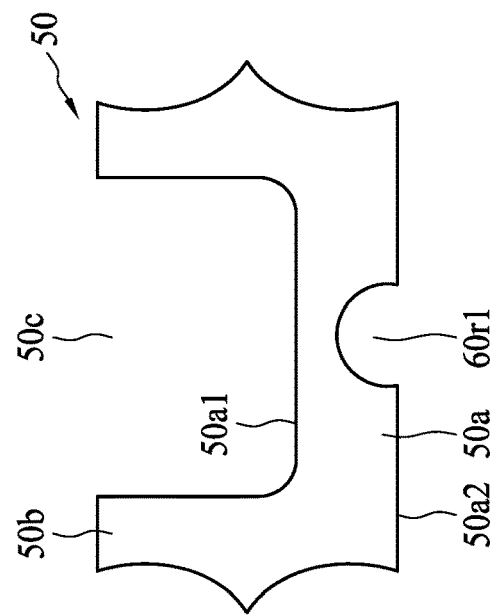
FIG. 6A, FIG. 6B, FIG. 6C and FIG. 6D illustrate a manufacturing process in accordance with some embodiments of the present disclosure.
Figure 6C:
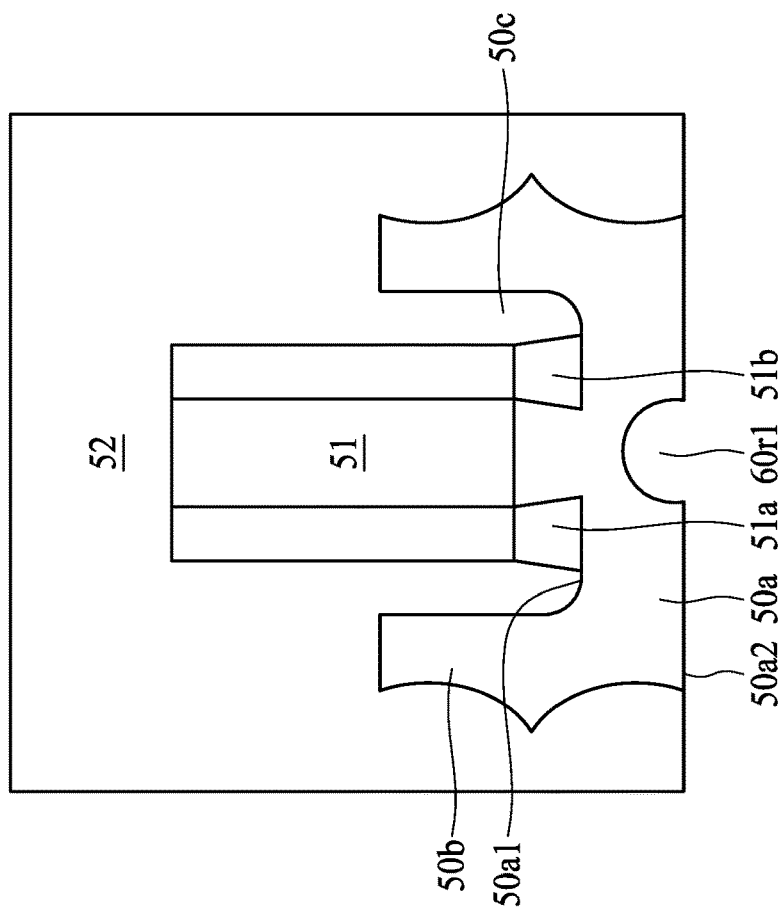
Figure 6B:
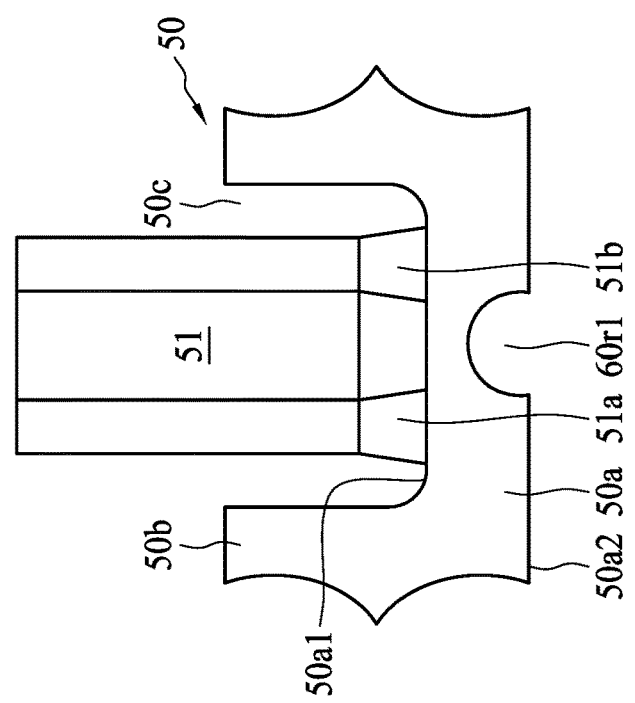
Figure 6D:
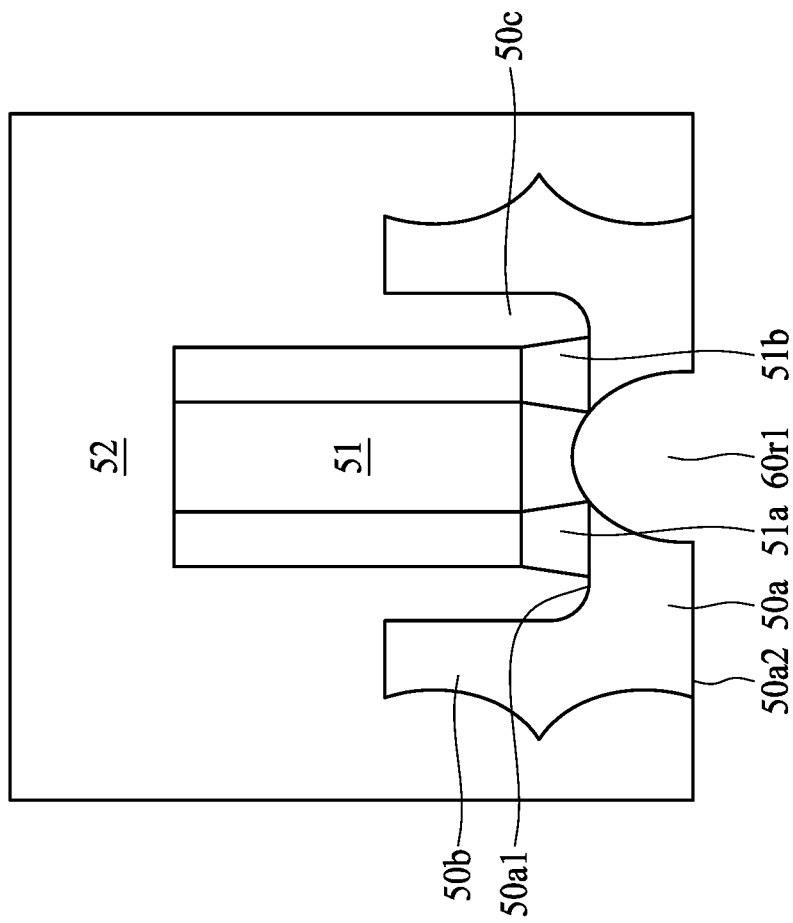

FIG. 6A, FIG. 6B, FIG. 6C and FIG. 6D illustrate a manufacturing process in accordance with some embodiments of the present disclosure. In some embodiments, the manufacturing process illustrated in FIG. 6A, FIG. 6B, FIG. 6C and FIG. 6D can be used to form the structure as shown in FIG. 1C. The operation in FIG. 6A is carried out subsequent to the operation in FIG. 5A. The manufacturing process illustrated in FIG. 6A, FIG. 6B, FIG. 6C and FIG. 6D is similar to that in FIG. 5B, FIG. 5C, FIG. 5D and FIG. 5E except that in FIG. 6A, the recess 60r1 is formed on the bottom surface 50a2 of the base portion 50a of the metal carrier 50. Therefore, as shown in FIG. 6D, the sidewall of the gap has one curved surface while in FIG. 5E, the sidewall of the gap has two curved surfaces connected to each other.

FIG. 7A, FIG. 7B, FIG. 7C, FIG. 7D and FIG. 7E illustrate a manufacturing process in accordance with some embodiments of the present disclosure.

Figure 7A:
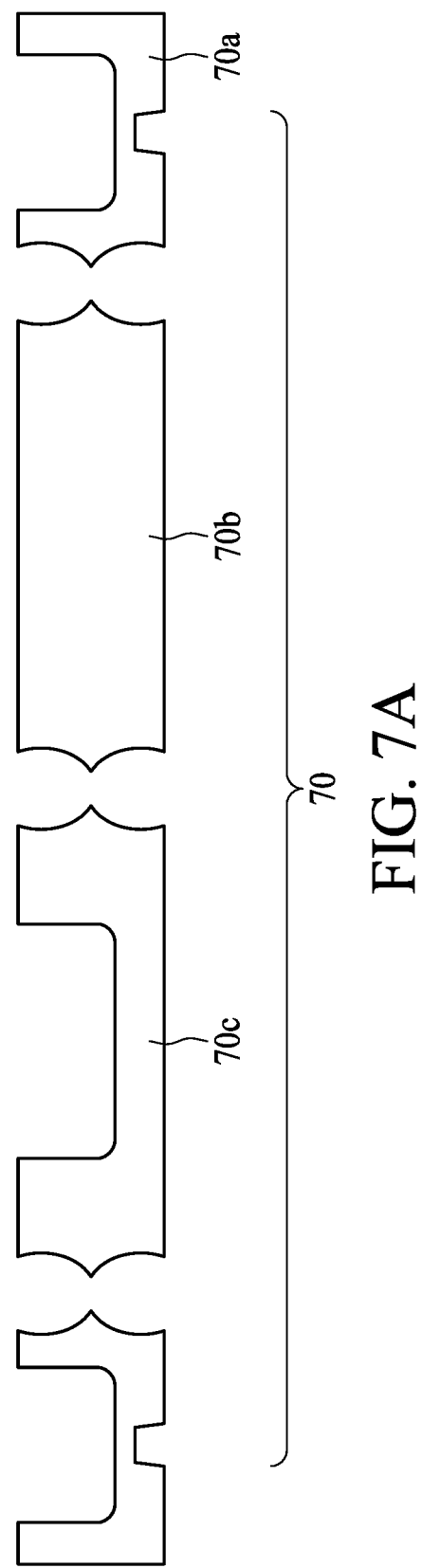
FIG. 7A, FIG. 7B, FIG. 7C, FIG. 7D and FIG. 7E illustrate a manufacturing process in accordance with some embodiments of the present disclosure.

Referring to FIG. 7A, a metal carrier 70 (e.g., a leadframe or a portion of a leadframe) is provided. The metal carrier 70 includes a plurality die pads 70a, 70b and 70c. In some embodiments, the die pad 70a is similar to the die pad illustrated in FIG. 6A. Alternatively, the die pad 70a is similar to the die pad illustrated in FIG. 5B. The die pads 70b and 70c are respectively similar to the die pads 10b and 10c illustrated in FIG. 1A. Therefore, the descriptions for the die pads illustrated in FIGS. 1A and 6A are applicable herein.

Figure 7B:
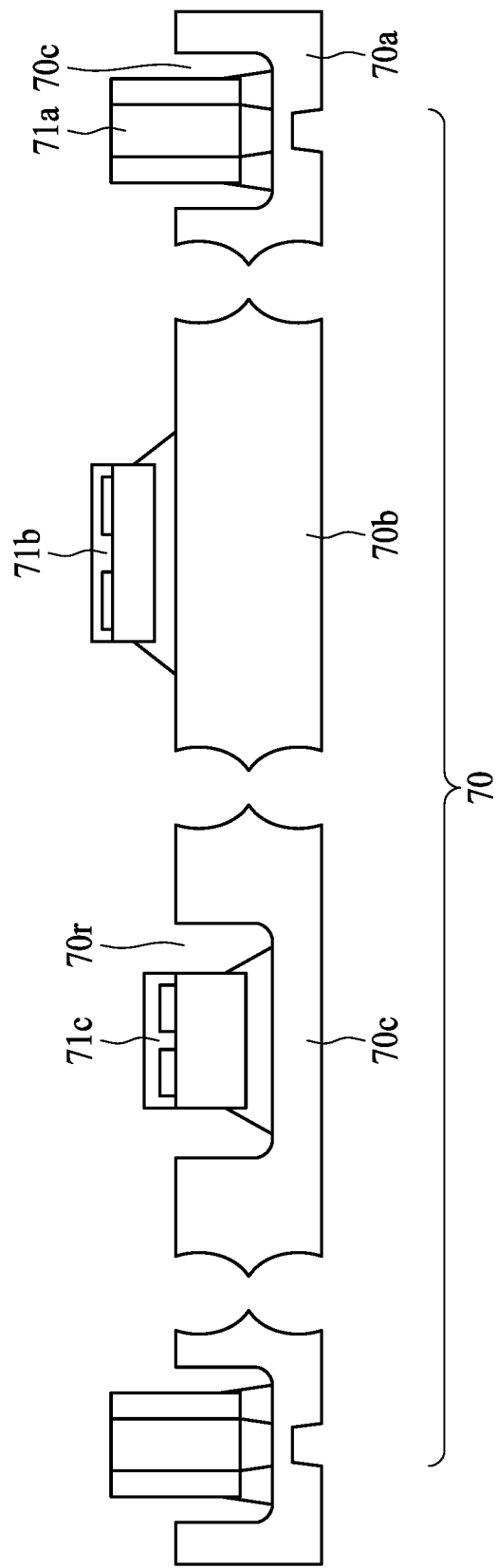

Referring to FIG. 7B, an electronic component 71a is disposed within the cavity 70c of the die pad 70a, an electronic component 71b is disposed on the die pad 70b, and an electronic component 71c is disposed within the cavity 70r of the die pad 70c. In some embodiments, the electronic components 71a, 71b and 71c are similar to the electronic components 11a, 11b and 11c in FIG. 1A, and thus the descriptions and properties of the electronic components 11a, 11b and 11c can be applicable to the electronic components 71a, 71b and 71c. In some embodiments, the electronic component 71a is disposed before disposing the electronic components 71b and 71c.

Figure 7C:
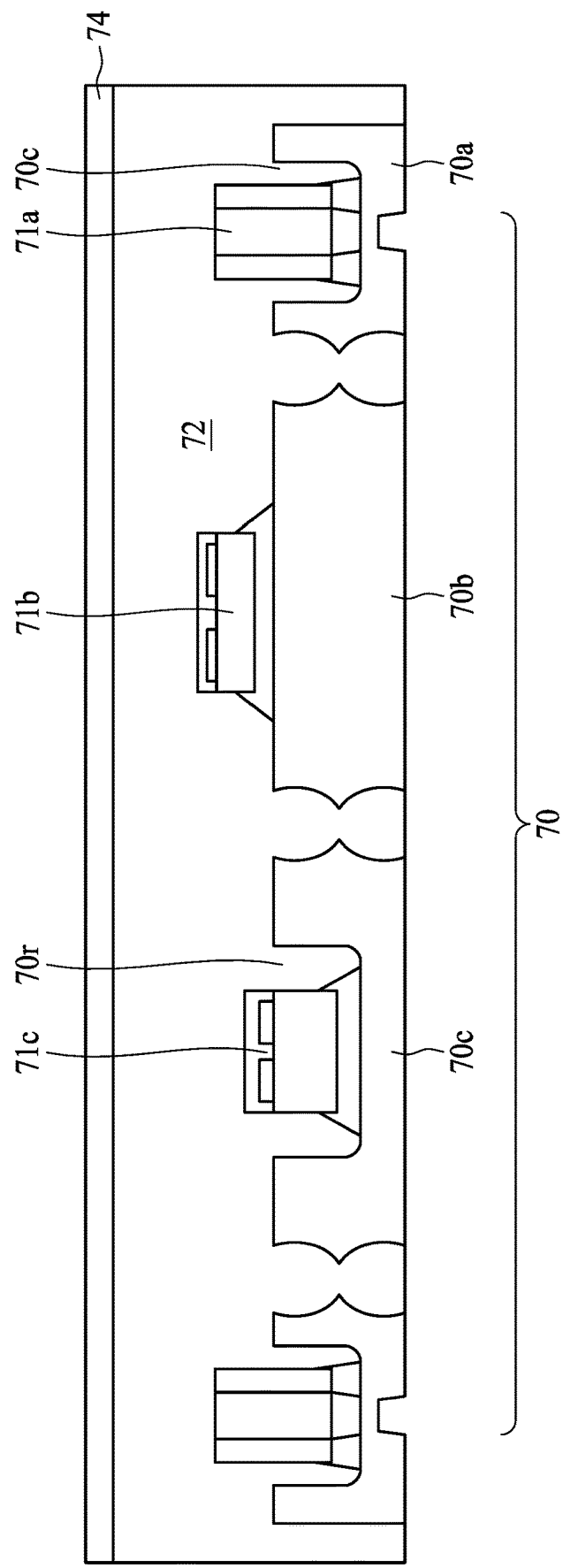

Referring to FIG. 7C, a dielectric layer 72 is formed to cover or encapsulate the metal carrier 70 and the electronic components 71a, 71b and 71c. In some embodiments, the dielectric layer 72 is similar to the dielectric layer 12 in FIG. 1A, and thus the descriptions and properties of the dielectric layer 12 can be applicable to the dielectric layer 12. In some embodiments, the dielectric layer 72 can be formed by lamination or other suitable operations. A conductive layer 74 is formed on the dielectric layer 72.

Figure 7D:
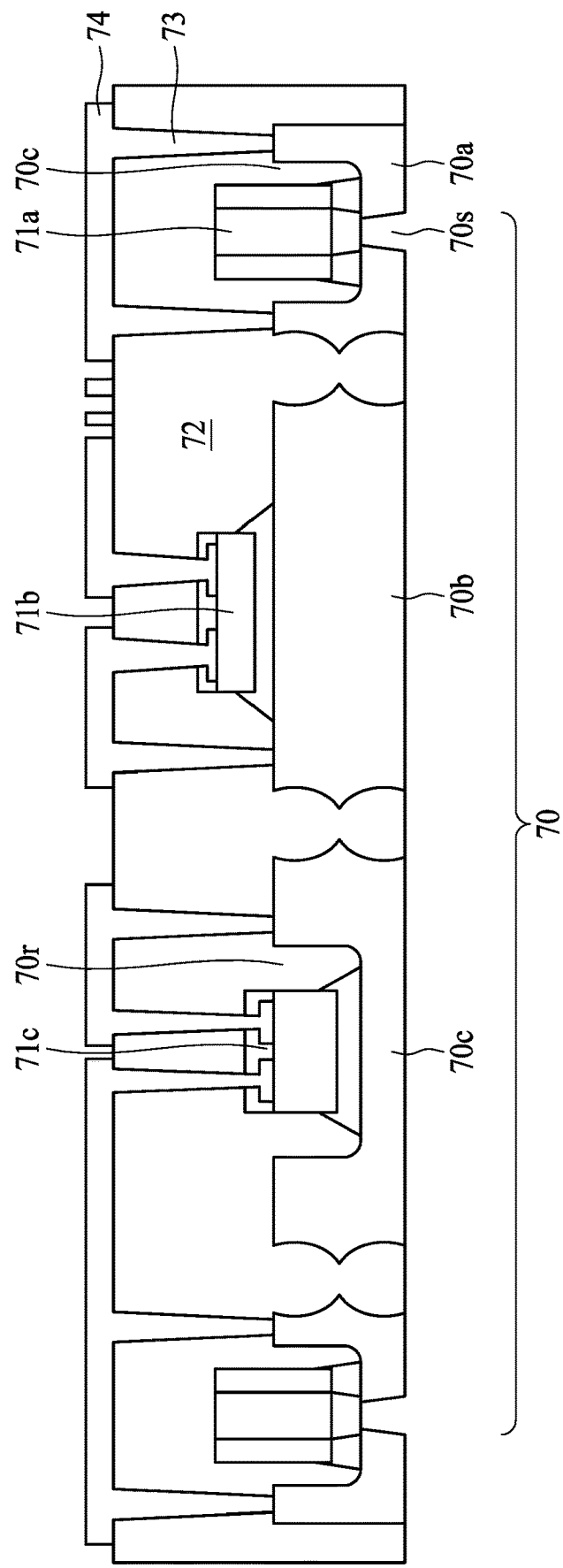

Referring to FIG. 7D, through vias 73 are formed to penetrate the dielectric layer 72 to electrically connect the die pads 70a, 70b and 70c with the conductive layer 72. In some embodiments, the through vias 73 may be formed by the following operations: (i) forming through holes to penetrate the conductive layer 74 and the dielectric layer 72 to expose a portion of the die pads 70a, 70b and 70c (e.g., the conductive pads of the die pads 70a, 70b and 70c) by, for example, laser drilling; and (ii) filing conductive material (e.g., tin or its alloy) within the through holes by, for example, plating or other suitable operations.

A patterning operation is carried out on the conductive layer 74 to form the patterned conductive layer. A portion of the dielectric layer 72 below the electronic component 71a is removed to form a recess 70s (or gap) to divide the die pad 70a into two separated portions. In some embodiments, the structure illustrated in FIG. 7D is similar to the semiconductor device package 1 in FIG. 1A, and thus the descriptions and properties of the semiconductor device package 1 can be applicable to the structure illustrated in FIG. 7D.

Figure 7E:
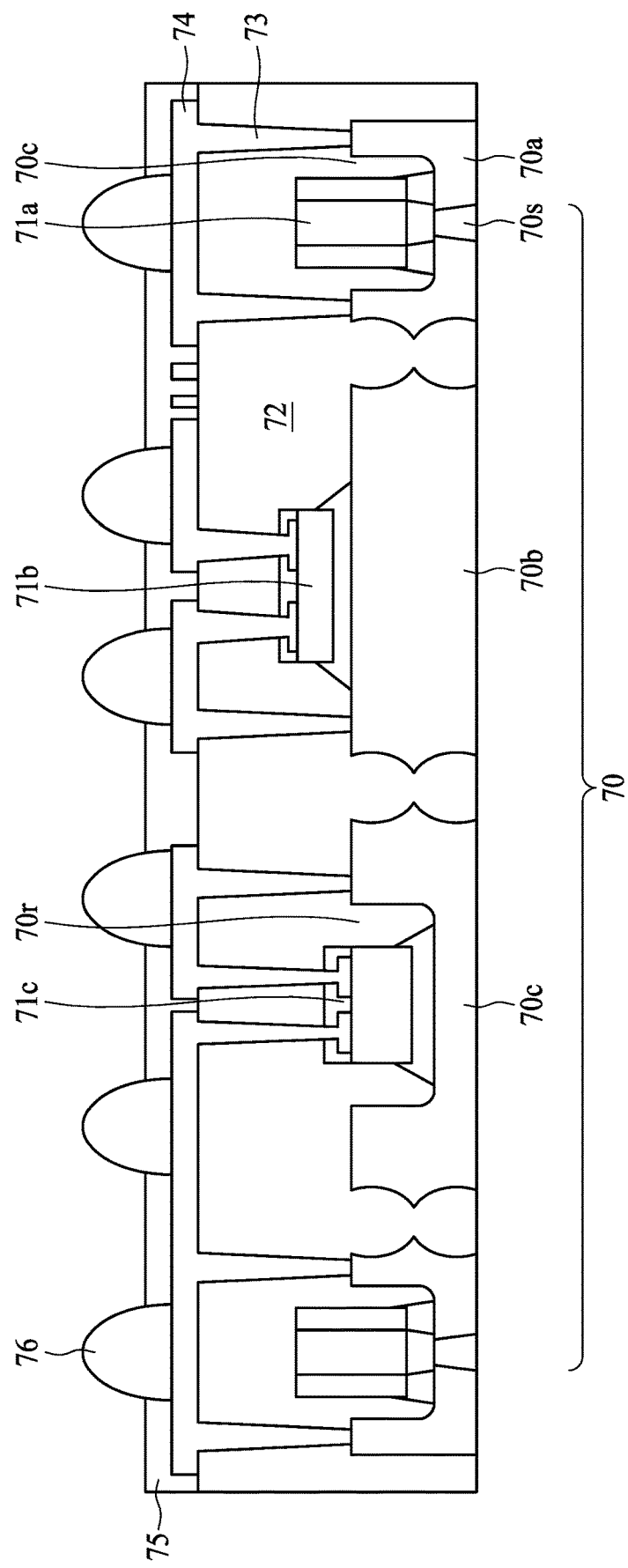

Referring to FIG. 7E, a solder mask (or solder resist) 75 is formed on the patterned conductive layer 74. The solder mask 75 has one or more recesses to expose a portion of the patterned conductive layer 74. Electrical contacts (e.g., solder balls) 76 are formed within the recesses to be electrically connected to the exposed portion of the patterned conductive layer 74. In some embodiments, a singulation operation can be carried out by, for example, sawing or other suitable operations.

Figure 8B:
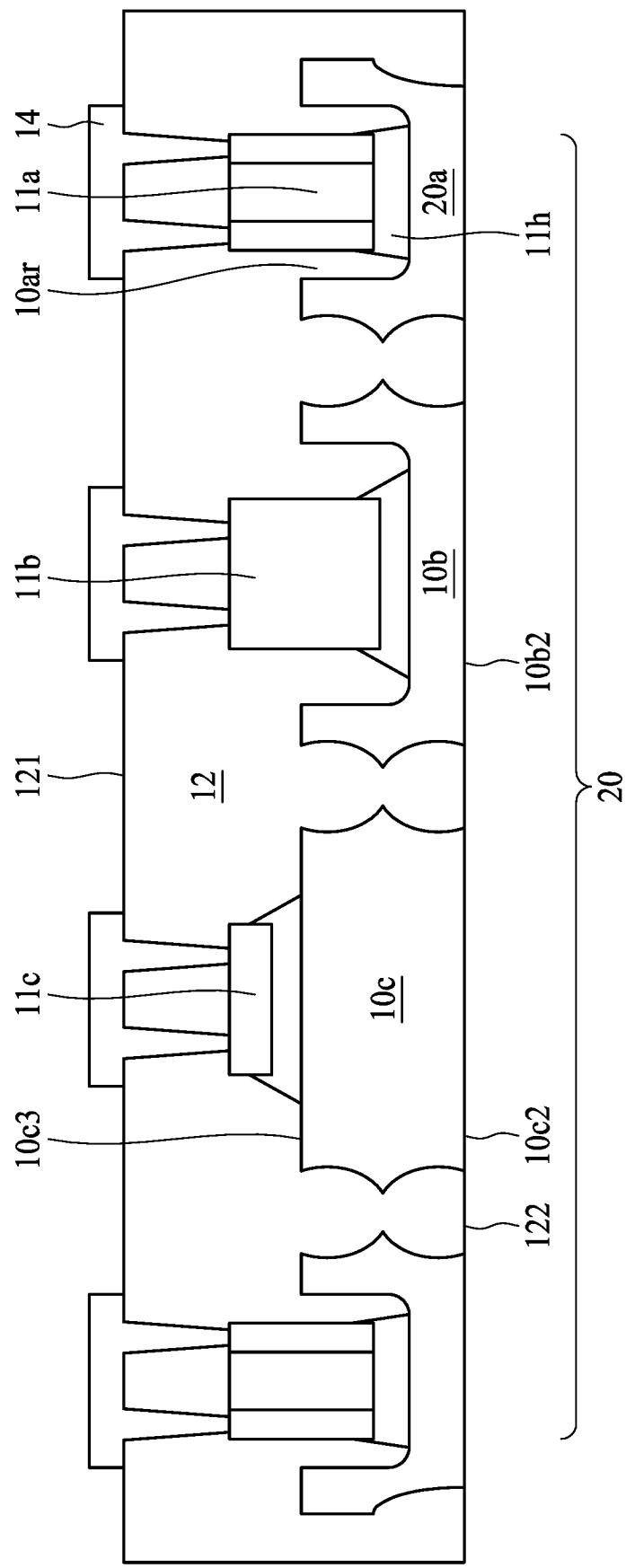
Figure 8C:
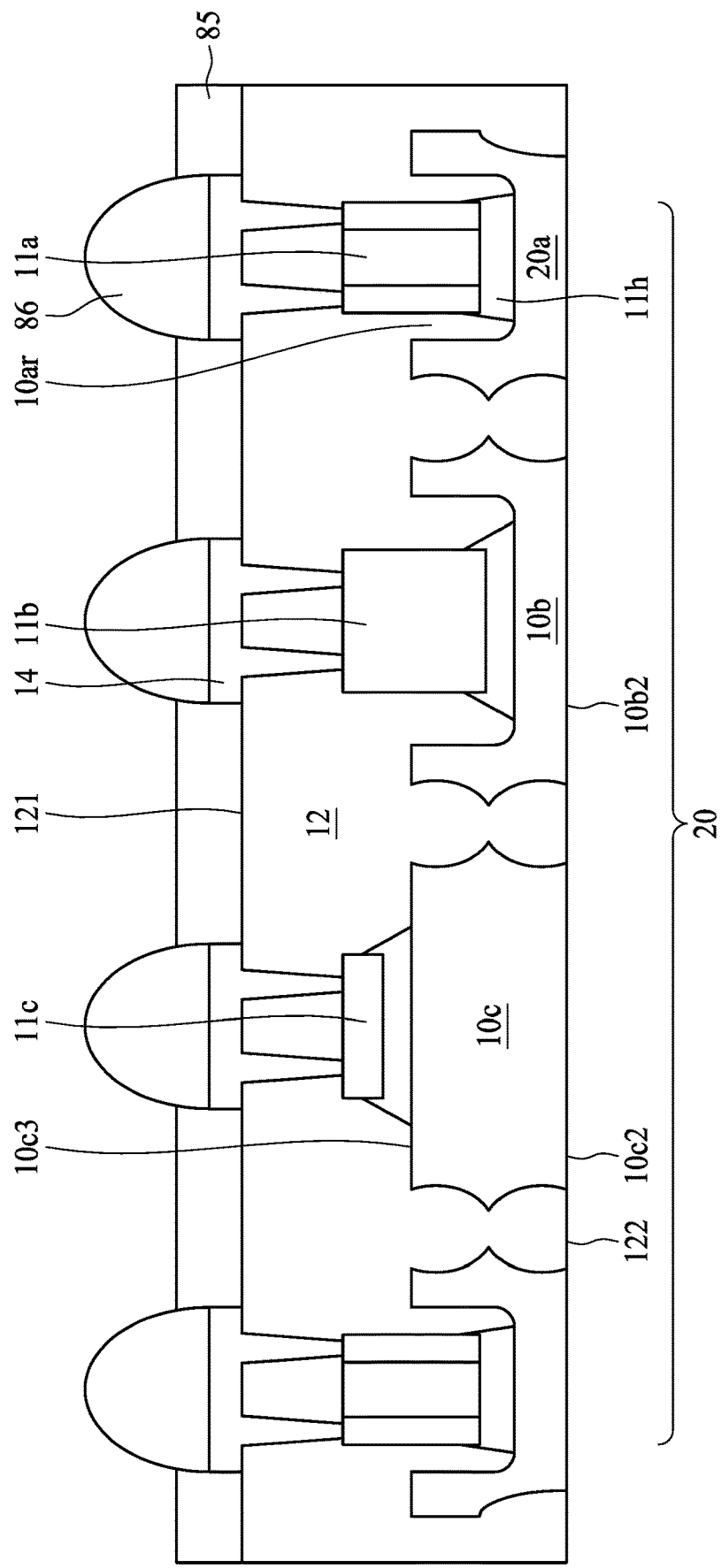

FIG. 8A, FIG. 8B and FIG. 8C illustrate a manufacturing process in accordance with some embodiments of the present disclosure.

Referring to FIG. 8A, the metal carrier 20 (e.g., a leadframe or a portion of a leadframe) is provided. The metal carrier 20 is similar to the metal carrier 20 illustrated in FIG. 2. Then, the operations as shown in FIGS. 7B, 7C and 7D are carried out to form the structure as shown in FIG. 8B except that the operation for removing a portion of the dielectric layer 72 as shown in FIG. 7D can be omitted and that the through via 13 is electrically connected to the conductive contacts of the electronic component 11a rather than the die pad 20a. In some embodiments, the structure illustrated in FIG. 8B is similar to the semiconductor device package 2 in FIG. 2, and thus the descriptions and properties of the semiconductor device package 2 can be applicable to the structure illustrated in FIG. 8B.

Referring to FIG. 8C, a solder mask (or solder resist) 85 is formed on the patterned conductive layer 14. The solder mask 85 has one or more recesses to expose a portion of the patterned conductive layer 14. Electrical contacts (e.g., solder balls) 86 are formed within the recesses to be electrically connected to the exposed portion of the patterned conductive layer 14. In some embodiments, a singulation operation can be carried out by, for example, sawing or other suitable operations.

Figure 9A:
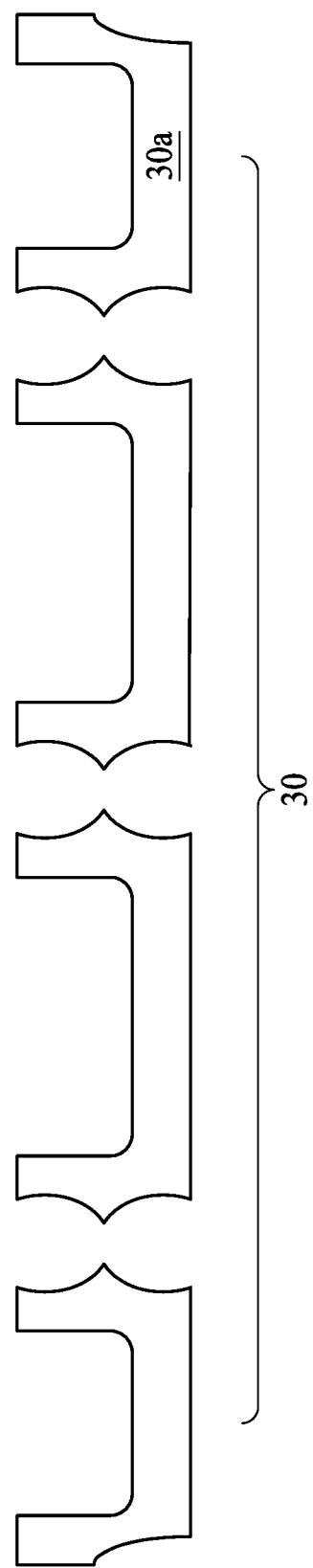
FIG. 9A, FIG. 9B and FIG. 9C illustrate a manufacturing process in accordance with some embodiments of the present disclosure.
Figure 9B:
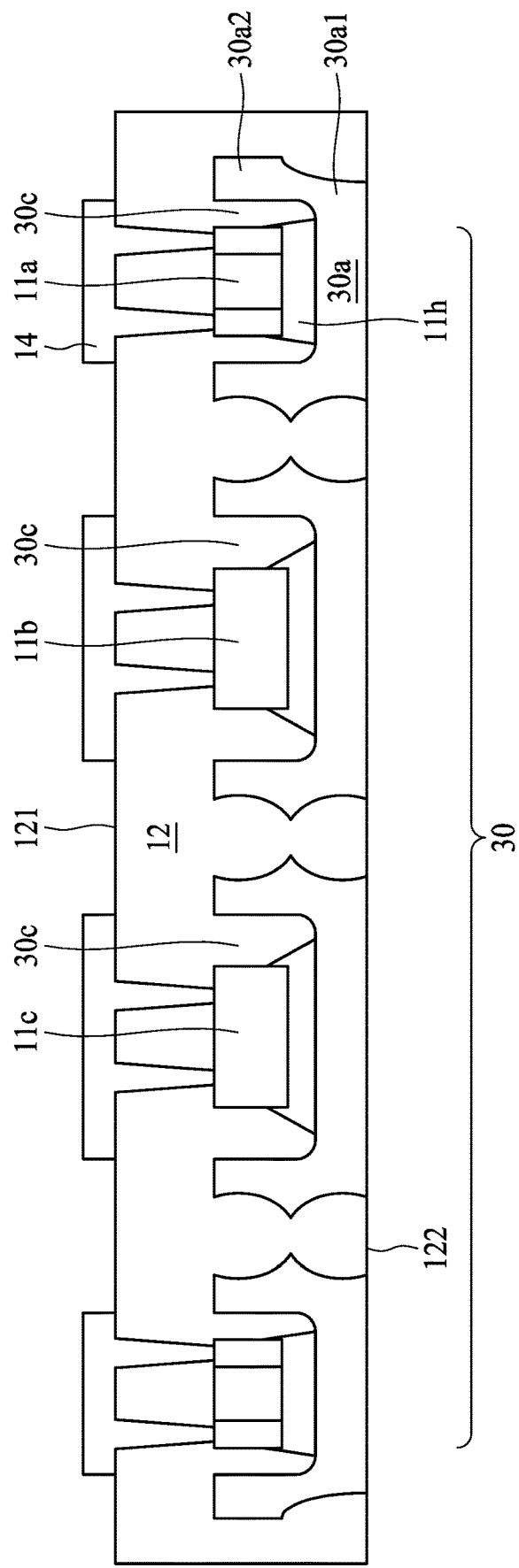
Figure 9C:
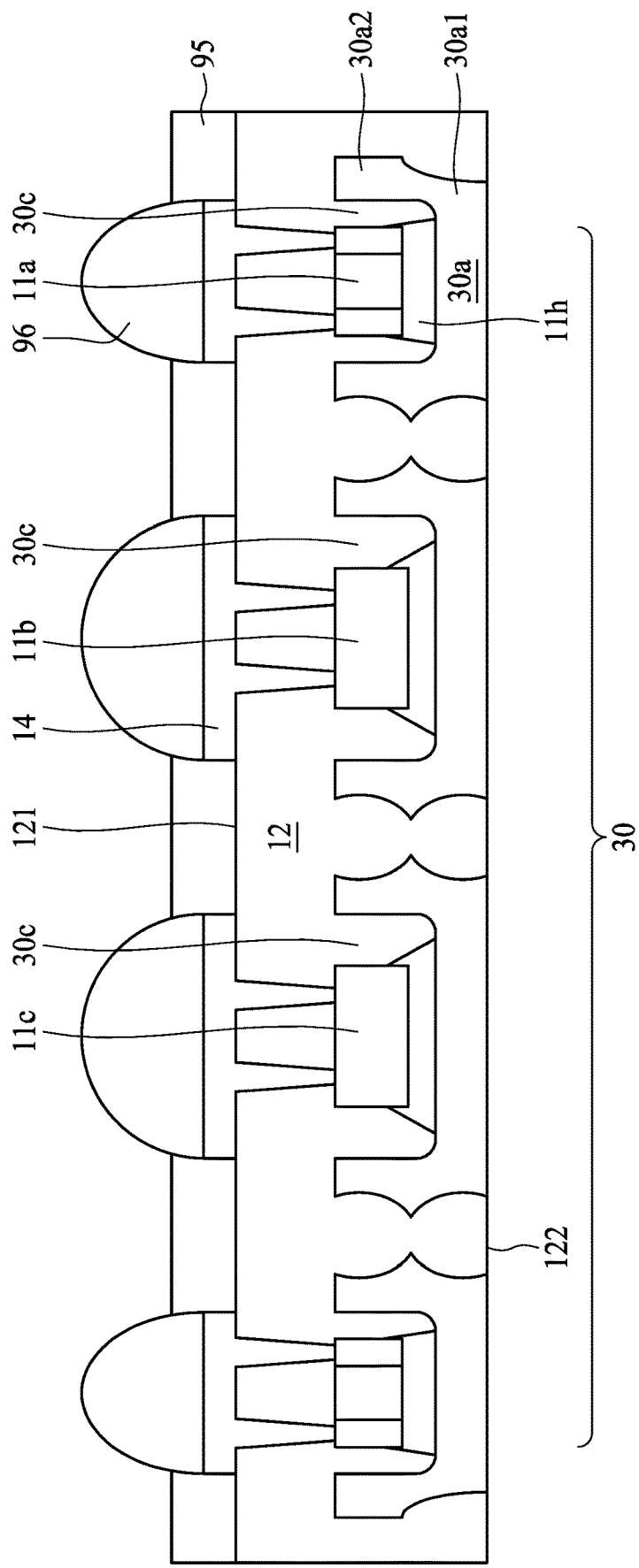

FIG. 9A, FIG. 9B and FIG. 9C illustrate a manufacturing process in accordance with some embodiments of the present disclosure.

Referring to FIG. 9A, the metal carrier 30 (e.g., a leadframe or a portion of a leadframe) is provided. The metal carrier 30 is similar to the metal carrier 30 illustrated in FIG. 3. Then, the operations as shown in FIGS. 7B, 7C and 7D are carried out to form the structure as shown in FIG. 9B except that the operation for removing a portion of the dielectric layer 72 as shown in FIG. 7D can be omitted and that the through via 13 is electrically connected to the conductive contacts of the electronic component 11a rather than the die pad 30a. In some embodiments, the structure illustrated in FIG. 9B is similar to the semiconductor device package 3 in FIG. 3, and thus the descriptions and properties of the semiconductor device package 3 can be applicable to the structure illustrated in FIG. 9B.

Referring to FIG. 9C, a solder mask (or solder resist) 95 is formed on the patterned conductive layer 14. The solder mask 95 has one or more recesses to expose a portion of the patterned conductive layer 14. Electrical contacts (e.g., solder balls) 96 are formed within the recesses to be electrically connected to the exposed portion of the patterned conductive layer 14. In some embodiments, a singulation operation can be carried out by, for example, sawing or other suitable operations.

Figure 10A:
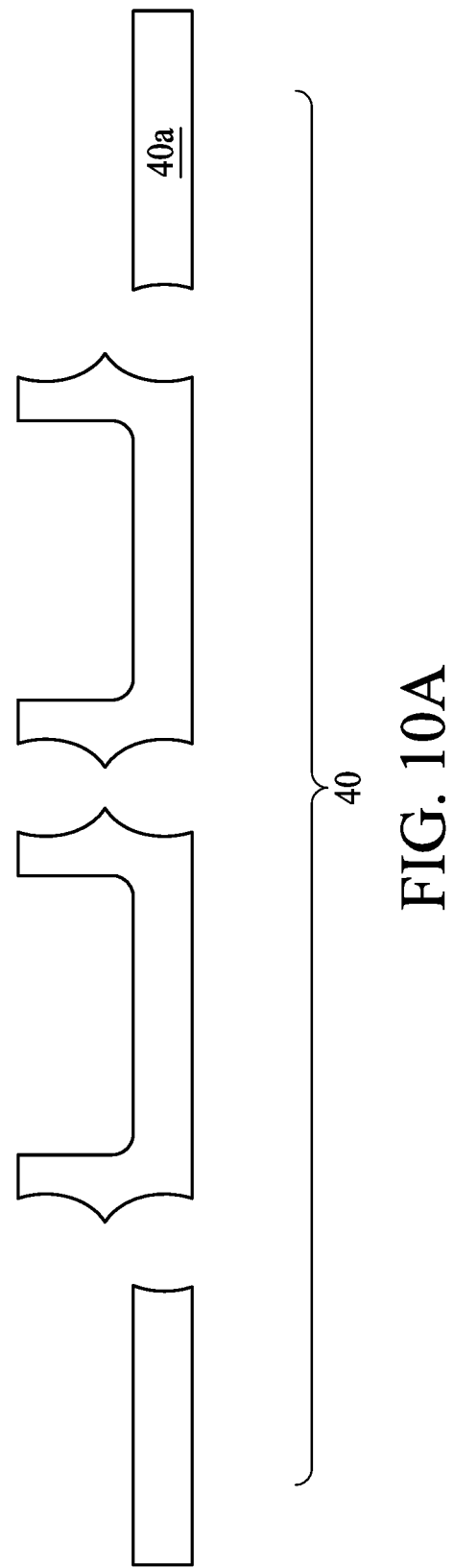
FIG. 10A, FIG. 10B and FIG. 10C illustrate a manufacturing process in accordance with some embodiments of the present disclosure.
Figure 10B:
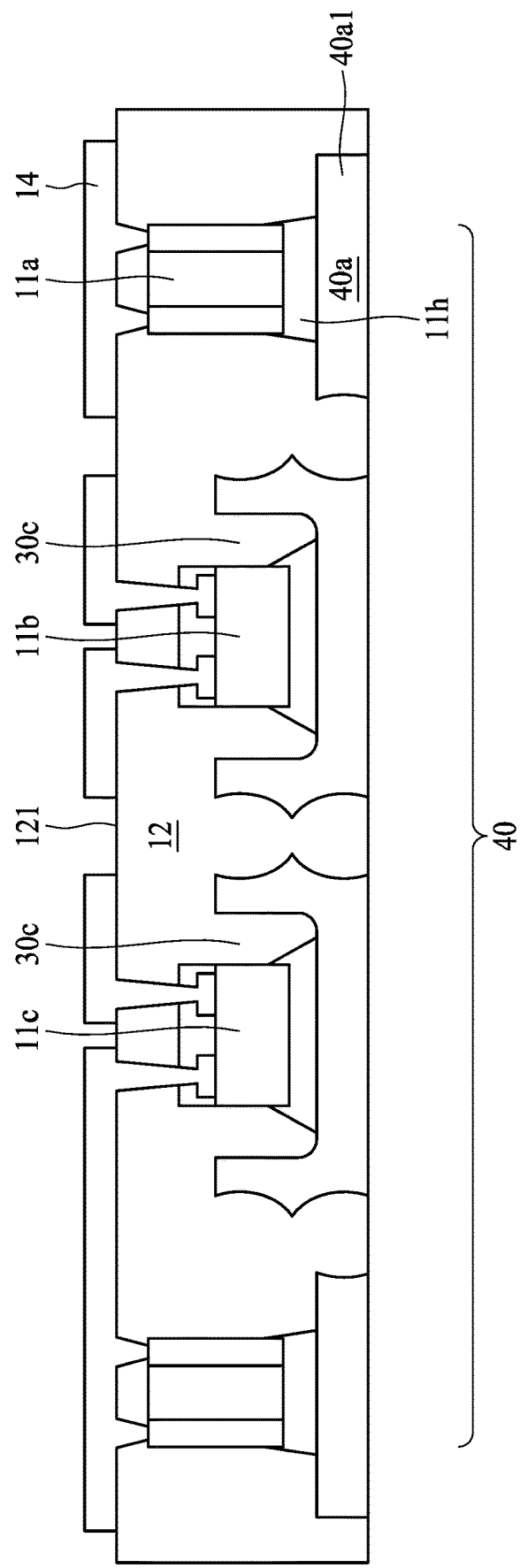
Figure 10C:
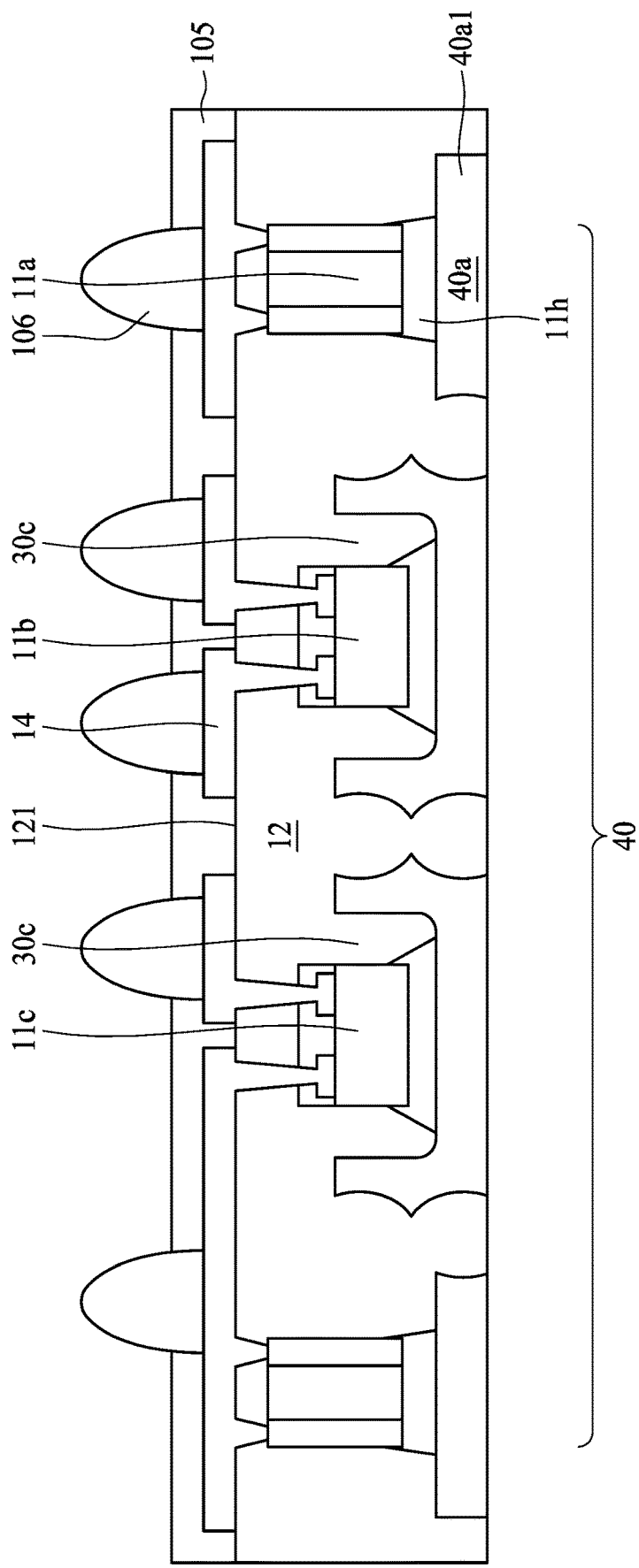

FIG. 10A, FIG. 10B and FIG. 10C illustrate a manufacturing process in accordance with some embodiments of the present disclosure.

Referring to FIG. 10A, the metal carrier 40 (e.g., a leadframe or a portion of a leadframe) is provided. The metal carrier 40 is similar to the metal carrier 40 illustrated in FIG. 4. In some embodiments, the extension portion of the die pad 40a can be removed by, for example, etching or other suitable operations. Then, the operations as shown in FIGS. 7B, 7C and 7D are carried out to form the structure as shown in FIG. 10B except that the operation for removing a portion of the dielectric layer 72 as shown in FIG. 7D can be omitted and that the through via 13 is electrically connected to the conductive contacts of the electronic component 11a rather than the die pad 40a. In some embodiments, the structure illustrated in FIG. 10B is similar to the semiconductor device package 4 in FIG. 4, and thus the descriptions and properties of the semiconductor device package 4 can be applicable to the structure illustrated in FIG. 4B.

Referring to FIG. 10C, a solder mask (or solder resist) 105 is formed on the patterned conductive layer 14. The solder mask 105 has one or more recesses to expose a portion of the patterned conductive layer 14. Electrical contacts (e.g., solder balls) 106 are formed within the recesses to be electrically connected to the exposed portion of the patterned conductive layer 14. In some embodiments, a singulation operation can be carried out by, for example, sawing or other suitable operations.

As used herein, the terms "substantially," "substantial," "approximately," and "about" are used to denote small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" or "substantially aligned" can refer to two surfaces within micrometers (μm) of lying along the same plane, such as within 100 μm, within 80 μm, within 60 μm, within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation. The term "substantially flat" can refer to a surface roughness (Ra) of about 20 μm or less, such as about 3 μm to about 20 μm, where a difference between a highest point and a lowest point of the surface is about 10 μm or less, such as about 5 μm to about 10 μm. As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package comprising:
a metal carrier having a first conductive pad and a second conductive pad, each of the first conductive pad and the second conductive pad having a top surface and a bottom surface;
a passive device disposed on the top surfaces of the first conductive pad and the second conductive pad, the passive device having a first conductive contact and a second conductive contact;
a conductive adhesive material electrically connecting the first conductive contact and the second conductive contact of the passive device to the first conductive pad and the second conductive pad respectively;
a dielectric layer covering the metal carrier and the passive device; and
a conductive via extending within the dielectric layer and electrically connected to at least one of the first conductive pad and the second conductive pad;
wherein the dielectric layer completely covers a top surface of the passive device;
wherein the bottom surface of the first conductive pad or the second conductive pad is exposed from the dielectric layer;
wherein the first conductive pad has a first lateral surface between the top surface and the bottom surface, the second conductive pad has a second lateral surface between the top surface and the bottom surface, and each of the first lateral surface and the second lateral surface includes a curved surface;
wherein each of the first lateral surface and the second lateral surface includes a first curved surface and a second curved surface connected to each other; and
wherein the first curved surface of the first lateral surface and the first curved surface of the second lateral surface define a first space in which the dielectric layer is disposed; and the second curved surface of the first lateral surface and the second curved surface of the second lateral surface define a second space exposed from the dielectric layer.

2. The semiconductor device package of claim 1, wherein the first conductive contact and the second conductive contact of the passive device include tin or its alloy.

3. The semiconductor device package of claim 1, wherein the metal carrier includes a cavity to expose the first conductive pad and the second conductive pad, and the passive device is disposed within the cavity.

4. The semiconductor device package of claim 1, wherein the first conductive pad and the second conductive pad define a space therebetween.

5. The semiconductor device package of claim 4, wherein the space is between the first lateral surface and the second lateral surface.

6. The semiconductor device package of claim 1, wherein the conductive via is disposed over the top surface of at least one of the first conductive pad and the second conductive pad.

7. A semiconductor device package comprising:
a metal carrier having a first conductive pad and a second conductive pad, each of the first conductive pad and the second conductive pad having a top surface and a bottom surface;
a passive device disposed on surfaces recessed down from the top surfaces of the first conductive pad and the second conductive pad, the passive device having a first conductive contact and a second conductive contact;
a conductive adhesive material electrically connecting the first conductive contact and the second conductive contact of the passive device to the first conductive pad and the second conductive pad respectively;
a dielectric layer covering the metal carrier and the passive device; and
one or more conductive vias disposed over the top surface of at least one of the first conductive pad and the second conductive pad and extending within the dielectric layer;
wherein the first conductive contact and the second conductive contact are physically spaced apart from any of the conductive vias.

8. The semiconductor device package of claim 7, wherein the first conductive contact and the second conductive contact of the passive device include tin or its alloy.

9. The semiconductor device package of claim 7, wherein the metal carrier includes a cavity to expose the first conductive pad and the second conductive pad, and the passive device is disposed within the cavity.

10. The semiconductor device package of claim 7, wherein
the first conductive pad having a first lateral surface between the top surface and the bottom surface;
the second conductive pad having a second lateral surface between the top surface and the bottom surface; and
each of the first lateral surface and the second lateral surface includes a curved surface.

11. The semiconductor device package of claim 10, wherein the first conductive pad and the second conductive pad define a space therebetween.

12. The semiconductor device package of claim 11, wherein the space is between the first lateral surface and the second lateral surface.

13. The semiconductor device package of claim 10, wherein each of the first lateral surface and the second lateral surface includes a first curved surface and a second curved surface connected to each other.

14. The semiconductor device package of claim 13, wherein
the first curved surface of the first lateral surface and the first curved surface of the second lateral surface define a first space in which the dielectric layer is disposed; and
the second curved surface of the first lateral surface and the second curved surface of the second lateral surface define a second space exposed from the dielectric layer.

15. The semiconductor device package of claim 7, wherein the metal carrier has a first sidewall on the first conductive pad and a second sidewall on the second conductive pad; wherein the first sidewall, the second sidewall, the first conductive pad, and the second conductive pad define a cavity; and wherein the one or more conductive vias are electrically connected to the first sidewall and the second sidewall.

16. The semiconductor device package of claim 15, wherein the passive device is partially disposed within the cavity.

17. The semiconductor device package of claim 7, wherein the dielectric layer completely covers a top surface of the passive device.

* * * * *